US009059361B1

(12) United States Patent
Legg et al.

(10) Patent No.: US 9,059,361 B1

(45) Date of Patent: Jun. 16, 2015

(54) MAGNESIUM DOPING OF BORON NITRIDE NANOTUBES

(71) Applicant: Jefferson Science Associates, LLC, Newport News, VA (US)

(72) Inventors: Robert Legg, Newport News, VA (US); Kevin Jordan, Newport News, VA (US)

(73) Assignee: JEFFERSON SCIENCE ASSOCIATES, LLC, Newport News, VA (US)

(*) Notice: Subject to any disclaimer, the term of this patent is extended or adjusted under 35 U.S.C. 154(b) by 0 days.

(21) Appl. No.: 14/077,256

(22) Filed: Nov. 12, 2013

Related U.S. Application Data

(63) Continuation-in-part of application No. 13/200,316, filed on Sep. 22, 2011, now Pat. No. 8,673,120.

(51) Int. Cl.

| | |
|---|---|
| ***B01J 19/12*** | (2006.01) |
| ***B82Y 40/00*** | (2011.01) |
| ***C01B 35/14*** | (2006.01) |
| ***H01L 39/12*** | (2006.01) |

(52) U.S. Cl.

CPC ............... *H01L 39/125* (2013.01); *B82Y 40/00* (2013.01); *C01B 35/146* (2013.01); *B01J 19/121* (2013.01)

(58) Field of Classification Search

CPC .... H01L 39/125; C01B 35/146; B01J 19/121; B01J 2219/0879; B82Y 30/00; B82Y 40/00; C04B 35/6229; C04B 2235/5284; C04B 2235/421; C04B 2235/6587; C04B 2235/3856; C04B 2235/46

USPC .......................... 204/157.41, 157.45, 157.46

See application file for complete search history.

(56) References Cited

U.S. PATENT DOCUMENTS 8,679,300 B2 * 3/2014 Smith et al. .............. 204/157.41
2005/0256006 A1 * 11/2005 Pfefferle et al. .............. 505/100

FOREIGN PATENT DOCUMENTS

| | | | | |
|---|---|---|---|---|
| CN | 1608976 | A | * | 4/2005 |
| CN | 101580236 | A | * | 11/2009 |
| CN | 101786884 | A | * | 7/2010 |
| CN | 101789300 | A | * | 7/2010 |
| JP | 2004149344 | A | * | 5/2004 |
| JP | 2005213119 | A | * | 8/2005 |
| JP | 2006240942 | A | * | 9/2006 |
| JP | 2008266101 | A | * | 11/2008 |

OTHER PUBLICATIONS

Wu et al, "Superconducting MgB2 Nanowires," Adv. Mater. 2001, vol. 13, No. 19, Oct. 2.*

(Continued)

*Primary Examiner* — Keith Hendricks
*Assistant Examiner* — Colleen M Raphael

(57) ABSTRACT

A method to fabricate boron nitride nanotubes incorporating magnesium diboride in their structure. In a first embodiment, magnesium wire is introduced into a reaction feed bundle during a BNNT fabrication process. In a second embodiment, magnesium in powder form is mixed into a nitrogen gas flow during the BNNT fabrication process. $MgB_2$ yarn may be used for superconducting applications and, in that capacity, has considerably less susceptibility to stress and has considerably better thermal conductivity than these conventional materials when compared to both conventional low and high temperature superconducting materials.

4 Claims, 2 Drawing Sheets

600
500
800
300
250
200

(56) References Cited

OTHER PUBLICATIONS

Dai et al, "A convenient catalytic approach to synthesize straight boron nitride nanotubes using synergic nitrogen source," Chem. Phys. Lett. 440 [2007] pp. 253-258.*

Terao et al, "Effective synthesis of surface-modified boron nitride nanotubes and related nanostructures and their hydrogen uptake," Physica E vol. 40 (2008), pp. 2551-2555.*

Riikonen et al, "Boron nitride formation on magnesium studied by ab initio calculations," Phys. Rev. B vol. 81, 125442 (2010).*

Golberg et al, "Boron nitride nanotubes as nanocrucibles for morphology and phase transformations in encapsulated nanowires of the Mg—O system," Acta Materialia 52 (2004) pp. 3295-3303.*

CN 101786884 A machine translation.*

CN 101580236 A machine translation.*

CN 101789300 A machine translation.*

CN 1608976 A machine translation.*

* cited by examiner

MAGNESIUM DOPING OF BORON NITRIDE NANOTUBES

This application is a continuation-in-part of U.S. patent application Ser. No. 13/200,316 filed on Sep. 22, 2011, which claims the benefit of U.S. Provisional Patent Application No. 61/460,534 filed Jan. 4, 2011.

The United States of America may have certain rights to this invention under Management and Operating Contract No. DE-AC05-84ER 40150 from the Department of Energy.

FIELD OF THE INVENTION

The invention relates generally to the production of nanostructures in particular to the formation of boron nitride nanotube fibers or filaments which incorporate magnesium in their structure.

BACKGROUND OF THE INVENTION

Since the announcement of the successful synthesis of high-aspect-ratio-few-walled boron nitride nanotubes (FW-BNNTs) in 1995, little progress had been made until very recently in the scale-up of their synthesis. In spite of the theoretical capabilities of FW-BNNTs to provide high strength-to weight, high temperature resistance, piezo actuation, and radiation shielding (via the boron content), the aerospace industry has had to rely on micron-sized graphite or boron fibers for structural applications. Further, despite their very desirable properties, neither FW-BNNTs nor single wall carbon nanotubes are used widely in aerospace manufacturing, as the industry is generally unwilling to pay the premium price for these high performance materials.

The Inventors' recent work in the field of boron nitride nanotubes is described in various US. patent applications filed over the past several years. Inventors' U.S. patent application Ser. No. 12/152,414 filed May 14, 2008 and incorporated herein by reference in its entirety describes a process for the production of at least centimeter-long boron nitride nanotube strands or fibers. Inventors' U.S. patent application Ser. No. 12/322,591 filed Feb. 4, 2009 and incorporated herein by reference in its entirety describes an apparatus for the production of boron nitride nanotubes and a method of continuous removal of the formed boron nitride nanotubes from the synthesis chamber. Inventors' U.S. patent application Ser. No. 12/387,703 filed May 6, 2009 and incorporated herein by reference in its entirety describes a method for the production of fibrils and yarns. Inventor's U.S. patent application Ser. No. 13/199,101 filed Aug. 19, 2011 and incorporated herein by reference in its entirety for a feedstock delivery device describes the delivery of material to a reaction chamber or process-controlled zone.

BNNTs created by these methods possess a variety of properties which make them ideal for numerous research and commercial purposes. In particular, they may be formed into yarns for a variety of uses. It has been postulated that further modified BNNT yarns might have application in the area of superconducting wire.

Conventional superconducting wire is currently being used in an ever-expanding array of technical applications, such as in superconducting magnets and in superconducting (high-efficiency) motors. Conventional high-temperature superconducting wire exhibits superconducting properties at higher temperatures, e.g., >70K, than traditional lower temperature superconducting materials. Nonetheless, conventional high-temperature superconducting wire is very susceptible to stress fractures during fabrication, winding, and operational use. Similarly, other analogous materials such as cuprate high-temperature superconductors, are rather expensive to produce and also share a likelihood of stress failure. Alternatively, low temperature superconducting wire, e.g., wire composed of Niobium-Tin or Niobium-Titanium, typically requires a temperature no higher than 9K to achieve superconductivity. Use of these materials usually requires the application of helium refrigeration. Further, these low-temperature superconducting materials have poor thermal conductivity making them susceptible to material failure as a result of local thermal runaway during magnetic quench conditions.

A need therefore exists for superconducting material that achieves required superconducting goals while eliminating the aforementioned problems or limitations.

SUMMARY OF THE INVENTION

The present disclosure provides a method for the production of boron nitride nanotubes doped with magnesium. A variety of methods may be used to form doped BNNT fibers that can be combined into yarns which have a variety of uses. For instance, Magnesium diboride ($MgB_2$) yarn may be used in superconducting applications. As opposed to both conventional low and high temperature superconducting materials, the $MgB_2$ superconducting yarn disclosed herein has considerably less susceptibility to stress and has considerably better thermal conductivity than these conventional materials. In addition, the yarn like consistency of the BNNT structure makes it much easier to wind on mandrills and bobbins for motor and coil applications. Finally, this type of material only needs to be cooled to 39K in order to achieve a superconducting state; this allows for operation with helium-free refrigeration.

The magnesium doped yarns may be formed by modifying certain BNNT fabrication processes disclosed in prior U.S. patent applications. In a preferred embodiment, magnesium wire is included in the feed bundle of a BNNT fabrication process. In one embodiment utilizing a pressure vapor-condenser process, $MgB_2$ doped BNNT fibrils are created through a pressure vapor-condenser process. In such a process, a boron-magnesium containing target, such as a hexagonal shaped boron nitride feedstock having a core of magnesium wire, is continuously introduced into a pressurized reaction chamber by a target feed system.

DETAILED DESCRIPTION

Magnesium diboride ($MgB_2$) is the highest temperature conventional superconductor known with a transition temperature of 39K. Its manufacture using a high pressure, high temperature process makes its inclusion in the BNNT fabrication process attractive. Several of the high pressure, high temperature methods of producing BNNTs using a metal feedstock, discussed supra and incorporated herein, may be adapted to allow doping of the nanotubes by magnesium (Mg) to form magnesium diboride ($MgB_2$). In a first embodiment, Mg wire may be included in the feed bundle for the BNNT reaction process. The fibers produced by such methods could be used in the construction of superconducting yarn.

$MgB_2$ doped nanotubes may be produced by the modification of one or more of the BNNT generation processes disclosed in the Inventors prior U.S. patent applications referenced above. For example, a pressure vapor-condenser process may be used to produce $MgB_2$ doped nanotubes. In such an embodiment, the production apparatus would comprise: a pressurized reaction chamber containing a continuously fed boron and magnesium containing target having a boron-magnesium target tip, a source of pressurized nitrogen and a moving belt condenser apparatus; a target feed system wherein the target feed system provides a continuously fed boron and magnesium containing target to the pressurized reaction chamber; a nitrogen control system in communication with the pressurized nitrogen; and, a laser beam and optics wherein the optics direct the laser beam into the pressurized reaction chamber.

Figure 1:
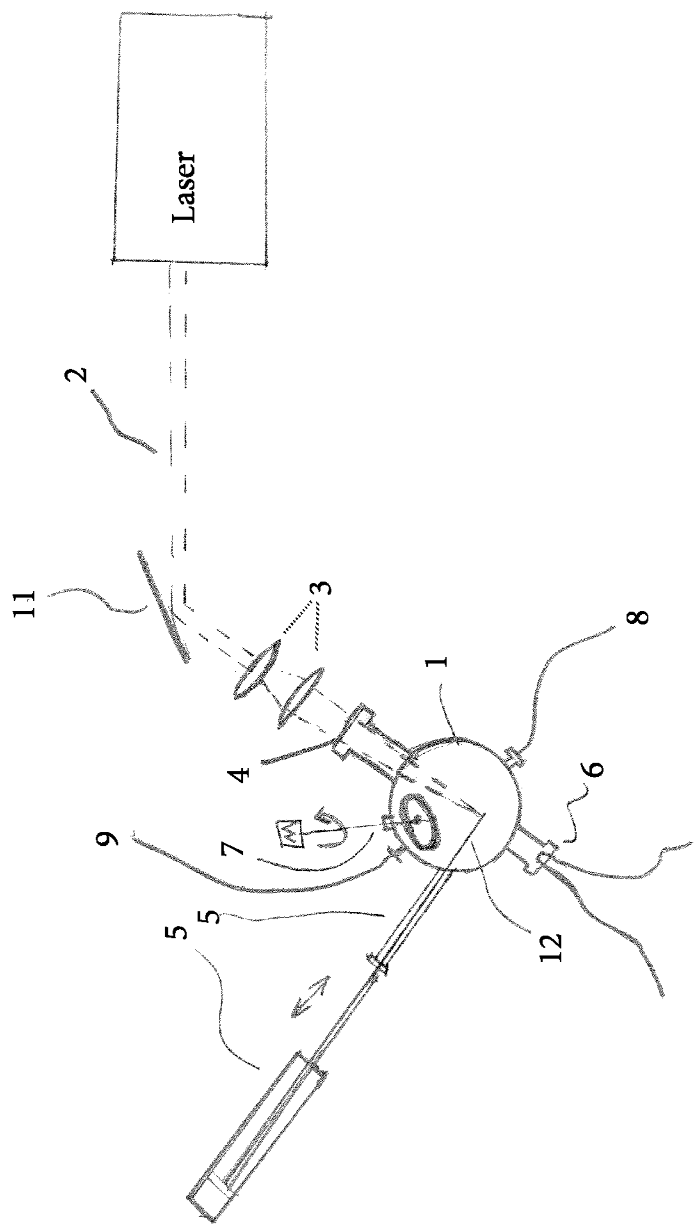
FIG. 1 is a diagram of an embodiment of an integrated production apparatus for production of magnesium doped boron nitride nanotubes.

FIG. 1 is a schematic drawing of one embodiment of the integrated production apparatus for production of magnesium doped boron nitride nanotubes via the pressure vapor-condenser method. The apparatus comprises a pressurized reaction chamber 1, laser beam 2, lens assembly to focus laser 3, laser input window 4, target feed system 5, water cooled beam dump 6, motorized condenser/collection system 7, nitrogen supply inlet 8, nitrogen supply outlet 9, and laser turning mirror 11. The target feed system 5 provides for supporting and continuously feeding a boron/magnesium target 12 into the pressurized reaction chamber 1.

A boron-magnesium containing target is continuously introduced into the pressurized reaction chamber by the target feed system. A preferred embodiment would utilize a hexagonal shaped boron nitride feedstock having a core of magnesium. This is easily formed by modifying a traditional boron nitride target by boring a hole or channel in the center of the boron target and filling the hole with magnesium, preferably in the form of magnesium wire.

Figure 2:
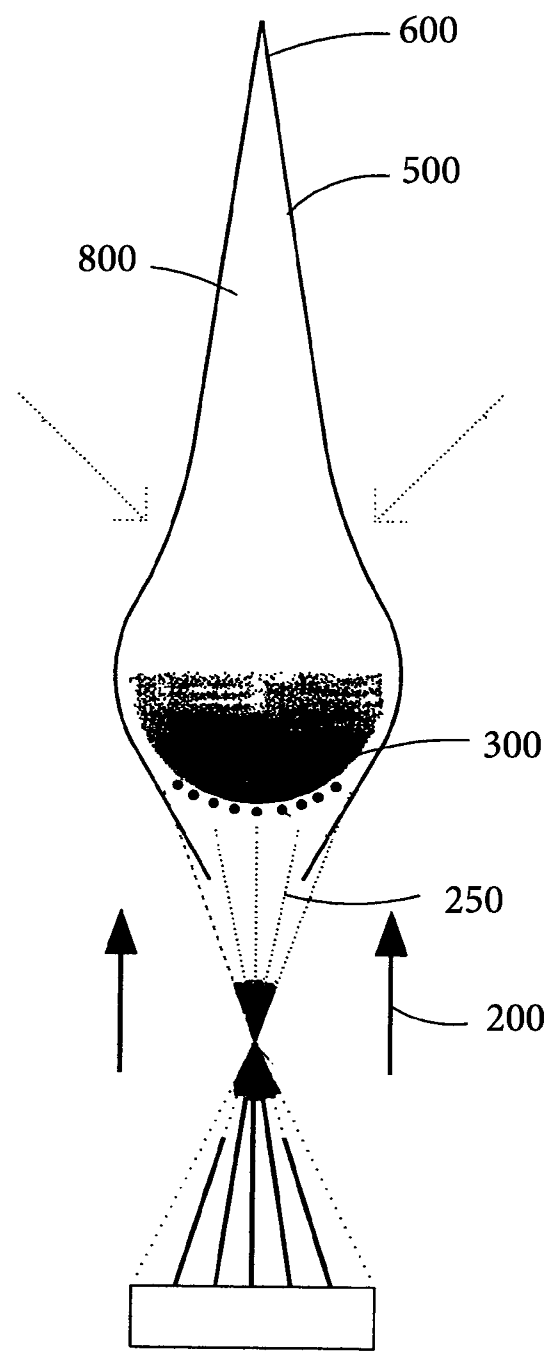
FIG. 2 is a diagram of a second embodiment of a production apparatus for production of magnesium doped boron nitride nanotubes.

Alternatively, magnesium doping may also be achieved via a modification of the combined laser-gas flow levitation process. FIG. 2 is a schematic representation of the formation of boron containing nanotubes in the combined laser-gas flow levitation process.

As FIG. 2 shows a boron ball target 300 which has a somewhat spherical or teardrop shape and a ball underside is placed in a gas flow 200 introduced below the boron ball target 300 and creating a circulation flow upward toward the boron ball target 300. In this embodiment the gas flow 200 is a mixture of nitrogen gas and magnesium in powdered form. First laser beam from the laser impinges the boron ball target 300 from below on the ball underside. The first laser beam is focused though optics to give optical focal point positioned between the laser and the boron ball target 300 which facilitates keeping the boron ball target 300 in the correct location as boron evaporates from the boron ball target 300. As the first laser beam impinges the boron ball target, the boron ball target heats to the melting point and evaporates, boron vapor plume 800 thus formed, rises upward from the boron ball target 300 and contacts the nitrogen-magnesium gas flow 200 creating a nanotube formation interface 500 in which boron nitride nanotubes are formed.

In this embodiment, the magnesium is introduced into the system as a magnesium powder mixed with the nitrogen gas flow 200 to allow doping of the nanotubes to form $MgB_2$. The nanotubes thus formed are carried upward by the boron vapor plume 800 and/or gas flow 200 and are collected at the terminus 600 of the boron vapor plume 800. An at least one second laser beam is positioned to impinge from above and slightly to the side onto the upper portion of the boron ball target 300 and/or forming boron vapor plume 800 to facilitate balancing the sideways or horizontal force acting on the boron ball target 300 and maintaining the boron ball target in a balanced substantially constant position.

The process set forth herein results in the insertion of Mg atoms in the BNNT lattice to make an approximately five nanometer, high temperature, superconducting material. Regardless of the process used, it is essential that the temperatures and pressures in the interaction region are adjusted to encourage the growth on $MgB_2$ rather than MgN.

Magnesium doped nanotubes may be formed into yarn which would retain the beneficial properties of BNNTs and would, therefore, overcome some of the deficiencies of conventional superconducting wires. Specifically, this yarn is considerably more flexible than conventional high-temperature superconducting wire and, therefore, more resistant to stress fractures and failures. Further, such yarn possesses better refractory properties and thermal flow than conventional low-temperature superconducting wire. Moreover, the yarn would exhibit superconducting properties at around 39K thereby alleviating the need for a helium refrigeration system in order to cool the materials to a superconducting state. This means that the material can be cooled using helium free Gifford-McMahon systems. It is also expected that this yarn would possess improved radiation resistance superior to conventional superconducting materials.

The superconducting yarn formed by these $MgB_2$ doped nanotubes would be ideal for winding high-strength magnets, such as those used in magnetic imaging resonance imaging devices, nuclear magnetic resonance devices, and superconducting high-efficiency motors. Other possible future uses include superconducting transmission lines for power, metal detectors, flexible superconducting power leads, transmission components and filters in the telecommunications industry, and in magnetic levitation apparatus for high-speed trains and other such means of transportation.

While the invention has been described in reference to certain preferred embodiments, it will be readily apparent to one of ordinary skill in the art that certain modifications or variations may be made to the system without departing from the scope of the invention claimed below and described in the foregoing specification.

What is claimed is:

1. A method of producing $MgB_2$ boron nitride nanotubes, the method comprising:

(a) providing an integrated production apparatus, the apparatus comprising: a pressurized reaction chamber containing a continuously fed boron-magnesium containing target having a boron and magnesium target tip, a source of pressurized nitrogen and a moving belt condenser apparatus including a belt surface; a target feed system wherein the target feed system provides a continuously fed boron and magnesium containing target to the pressurized reaction chamber; a nitrogen control system in communication with the pressurized nitrogen; and a laser beam and optics wherein the optics direct the laser beam though a laser beam tube and into the pressurized reaction chamber;

(b) providing nitrogen gas to the pressurized reaction chamber to maintain a pressure of about 50 to 1000 psi in the pressurized reaction chamber;

(c) providing a laser beam and maintaining a laser power within the range of 100 to 25,000 W;

(d) directing the laser beam to the tip of the boron-magnesium target; and (e) collecting $MgB_2$ boron nitride nanotubes on the belt surface of the moving belt condenser apparatus.

2. The method of claim 1 wherein providing nitrogen gas comprises providing nitrogen gas to the pressurized reaction chamber to maintain a pressure of about 150 to 200 psi in the pressurized reaction chamber.

3. The method of claim 1 wherein providing a laser beam comprises providing a laser beam and maintaining a laser power within the range of 1000 to 2500 W.

4. A process for producing $MgB_2$ boron nitride nanotubes, the process comprising the steps:

(a) providing a boron ball target, a first laser beam having an adjustable power level and a gas flow comprising nitrogen gas incorporating powdered magnesium;

(b) positioning the boron ball target in a reaction position above the first laser beam and in the gas flow, the reaction position comprising a vertical reaction position and a horizontal reaction position;

(c) adjusting the power level of the first laser beam to provide sufficient force from the first laser beam to the boron ball target to balance the force of gravity and the force of a light from above the boron ball target acting downward on the boron ball target and maintain the boron ball target in the vertical reaction position;

(d) heating the boron ball target with the first laser beam wherein the heating evaporates a portion of the boron ball target and forms a boron vapor plume;

(e) adjusting the power level of the first laser beam to maintain the heated boron ball target balanced in the reaction position as the boron vapor plume moves upward from the boron ball target;

(f) providing at least one second laser beam positioned above and to the side of the boron ball target, wherein the at least one second laser beam exerts a second laser beam force on the boron ball target to maintain the boron ball target in the horizontal reaction position; and, (g) forming a plurality of $MgB_2$ boron nitride nanotubes as the upward moving boron vapor plume contacts the nitrogen and magnesium in the gas flow.

* * * * *